July 31, 1962 MASAO TAKAHASHI ETAL 3,046,641

AUTOMATIC ASSEMBLING APPARATUS FOR ASSEMBLING CLEAN SEMICONDUCTORS IN CLEAN SHELLS

Filed Dec. 11, 1959 2 Sheets-Sheet 1

July 31, 1962 MASAO TAKAHASHI ETAL 3,046,641

AUTOMATIC ASSEMBLING APPARATUS FOR ASSEMBLING CLEAN SEMICONDUCTORS IN CLEAN SHELLS

Filed Dec. 11, 1959 2 Sheets-Sheet 2

United States Patent Office 3,046,641

Patented July 31, 1962

3,046,641

AUTOMATIC ASSEMBLING-APPARATUS FOR ASSEMBLING CLEAN SEMICONDUCTORS IN CLEAN SHELLS

Masao Takahashi, Tokyo, Sumio Imaoka, Yokohama, and Osamu Kubouchi, Tokyo, Japan, assignors to Tokyo Shibaura Electric Co., Ltd., Kawasaki-shi, Japan, a corporation of Japan Filed Dec. 11, 1959, Ser. No. 858,901
2 Claims. (Cl. 29—203)

The present invention relates to an automatic sealing apparatus for sealing a semiconductor element in a case or shell, the sealing being effected in a clean dried circulating atmosphere.

It is known to hermetically seal a semiconductor element mounted on a stem in a shell or case, the sealing operation being carried out manually in a gas tight casing. Sealably supported in the casing is a pair of rubber gloves into which both hands of the operator are inserted, control being effected by observance through a glass viewing window in the casing. As will readily be understood, it involves various difficulties to fill such a casing, which has a considerable volume, with clean air or other gaseous substance. Furthermore, the known sealing apparatus is also subject to the disadvantages of extremely low operating efficiency, because of the inconvenience for the introduction and removal of parts and finished products, and of the inadequacy for adaption to mass production.

The present invention has for its object to provide an improved automatic sealing apparatus for semiconductor devices which has highly improved operating efficiency and thus is capable of being adapted to mass production, by completely obviating the use of a gas tight casing, which has many inconveniences and disadvantages as described hereinbefore.

Another object of the present invention is to provide an automatic sealing apparatus for a semiconductor element in which the semiconductor element cleaned in advance of its supply to said apparatus is enclosed and sealed into a preliminarily cleaned shell together with a clean dry gas, thus eliminating inefficient and time-consuming manual work within air-tight boxes as heretofore required in semiconductor assembling.

Another object of the present invention is to provide an improved automatic sealing apparatus which is adapted to hermetically seal a semiconductor element and a shell together in an atmosphere of clean dried gas and suited to the production at high output of semiconductor devices having semiconductor elements free from secular change, without employing a gas tight casing which is inconvenient and disadvantageous.

The present invention is characterized by the fact that for the purpose of attaining the above objects it effects the sealing of a semiconductor element in a shell or case in a flow of clean and dried gas, and according to the present invention the automatic sealing apparatus comprises a holder for a stem having a semiconductor element mounted thereon and a second holder for a case or shell adapted to enclose said semiconductor element in sealing relation. There is further provided a sleeve in which said holders are slidably supported with the stem and shell on the respective holders opposed to one another so as to be relatively movable toward and away from each other. The holders and sleeve define a chamber and gas feeding means are provided for maintaining a flow of clean and dry gas in the chamber defined by said sleeve and the holders. The apparatus additionally comprises means for moving said holders relatively towards each other to tightly seal said clean semiconductor element in said clean shell.

These and other objects and features of the present invention will be apparent from the following description of an embodiment of the present invention illustrated by way of example in the accompanying drawings in which.

Figure 1:
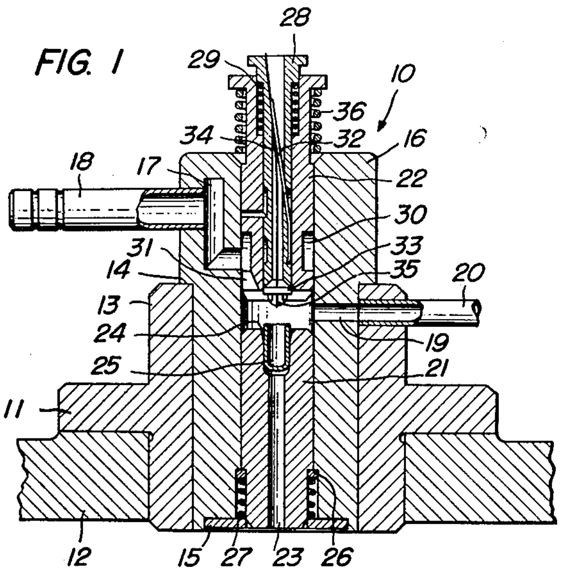
FIGURE 1 is a longitudinal cross-sectional view in front elevation, of a sealing apparatus for semiconductor devices according to the present invention.

Referring to the drawings, particularly to FIGURE 1, the sealing apparatus is mounted in an hollow bore formed in a cylindrical support 13 mounted on a suitable base 12 by means of a flange 11 of said support, and is provided with a sleeve 16 supported by the top face or shoulder 14 of the support 13 and a plate 15 located at the bottom. Provided in the side wall of the sleeve 16 is a fluid passageway 17 communicating with a pipe connection 18 secured to said side wall for introducing the gas. Provided also in the side wall in a position substantially opposite to said pipe connection or inlet pipe 18 and slightly below the level thereof is an outlet opening 19 in communication with another pipe connection or outlet pipe 20 secured to said support 13. Longitudinally slidably fitted in the lower portion of the through bore in said sleeve 16 is a shell holder 21 while a stem holder 22 is similarly fitted in the upper portion of the through bore in said sleeve 16 in opposed relation to said shell holder 21.

The shell holder 21 has a longitudinal through bore 23 formed centrally thereof and forming a recess at the top of said bore for accommodating a shell 25 so that the latter may conveniently be pushed upwardly from the bottom for replacement. The shell holder 21 is formed with a shoulder outside of the lower portion thereof to receive a washer 26. A coil spring 27 is arranged between said washer 26 and said plate 15 located at the bottom of said sleeve 16.

The stem holder 22 also is in the form of a sleeve having a through bore centrally thereof for slidably supporting a stem chuck 28 with a spring 29 interposed between the latter and the stem holder 22. Formed in said holder 22 at its periphery is an annular fluid passageway 30 which communicates at a point with an orifice 31 opening outward at the inner or lower end of said stem holder 22. It will be noted that the fluid passageway 30 is normally in communication with the fluid passageway 17 formed in the sleeve 16. Also, provided in the interior of the sleeve 22 is a leaf spring 32 which serves to clamp or chuck a lead wire 34 of a stem 33 as mounted on the bottom of said holder 22.

In operation of the sealing apparatus, the shell 25 is first accommodated in the recess 24 at the top of the shell holder 21 disposed in the sleeve 16 with the open end of the shell facing upwardly as shown in FIGURE 1. The stem 33, comprising a semiconductor element 35 attached to the lead wire 34 at its bottom end, is mounted in the bottom portion of the stem holder 22.

The free end of the lead wire 34 is inserted upwardly into the through bore in the stem holder 22, which has previously been removed out of the sleeve 16, and clamped or chucked in place by means of the spring 32.

The stem holder 22 with a stem 33 is fitted into the through bore in the sleeve 16 toward the shell holder 21 having a shell 25 therein so as to place the semiconductor element in position opposite to the shell 25. Then, clean and dry gas such as oxygen, nitrogen or air is fed through the inlet pipe 18 into the passageway 17 and thence is injected through the annular groove 30 and the orifice 31 into into a space or chamber defined by the inner wall of the sleeve 16, the lower end face of the stem holder 22 and the upper end face of the shell holder 21, thereby to clean the interior of the shell 25 and the semiconductor element 35 and drive out the air within said space through the exhaust pipe 20 while the gas also flows out slowly therethrough. It will thus be noted that the space or chamber is maintained in a state such that clean gas is continuously circulating throughout the space.

In this state, the stem holder 22 is depressed downwardly against the action of the spring 36 to place the semiconductor element 35 of the stem 33 held by the holder 22 in position within the shell 25 held by the holder 21 while forcing the stem 33 into the opening of the shell 25 to form a seal therebetween. Such sealing may be effected by any of hermetical sealing processes such as projection welding, cold welding (cold press) and cold soldering.

As disclosed above, the sealing apparatus according to the present invention is arranged so that a shell held by the holder 21 and a stem held by the holder 22 and having a semiconductor element mounted thereon are located in a continuously flowing stream of clean and dry gas in the sleeve 16 for cleaning and sealing effects. It will be readily recognized that with this sealing apparatus the sealing operation may be carried out easily with no troubles while at the same time enabling the manufacture of semiconductor devices at high yield which are free from deterioration, in contrast with conventional sealing apparatus which are inconvenient and disadvantageous in that sealing operation is manually performed within a large gas tight casing having a glass window formed therein, which casing is partially filled with gas in a static state.

Figure 2:
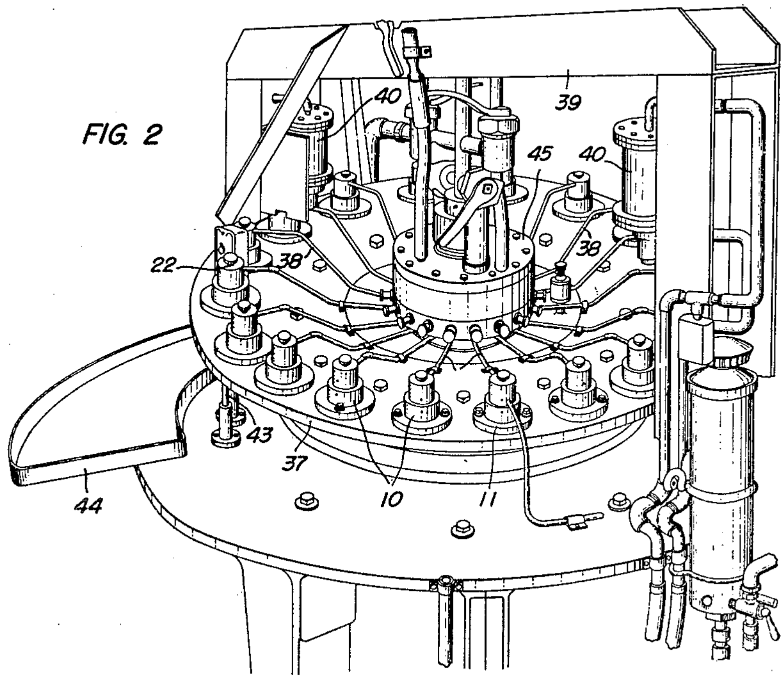
FIGURE 2 is a perspective view of a continuous automatic sealing machine provided with the sealing apparatus as shown in FIGURE 1.
Figure 3:
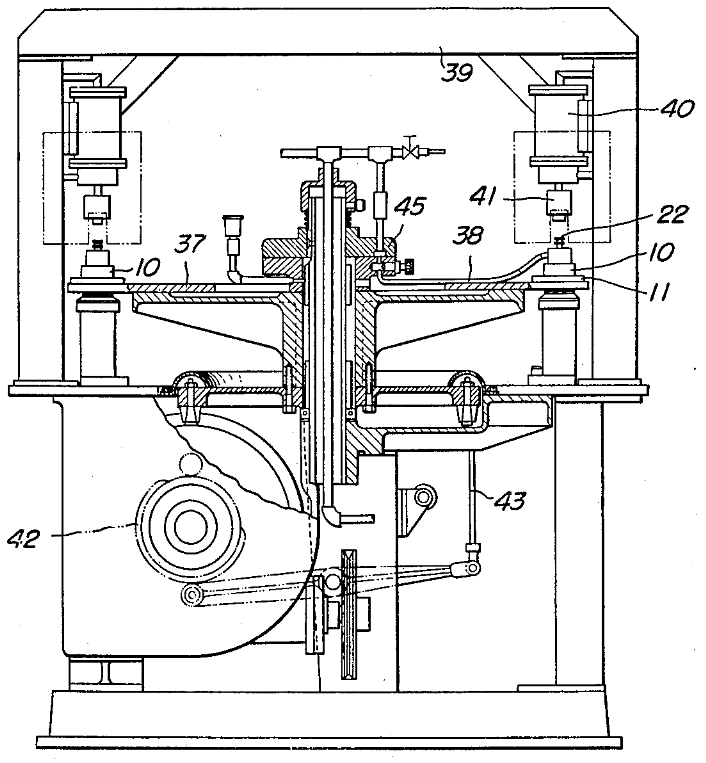
FIGURE 3 is a fragmentary longitudinal cross-sectional view in front elevation, of the sealing machine in FIG. 2.

Further, for the purpose of mass production, the sealing apparatus according to the present invention preferably is incorporated in a continuous automatic sealing machine as shown in FIGURES 2 and 3. The machine comprises a table 37 adapted to rotate intermittently at predetermined intervals and carrying a plurality of the aforenoted sealing apparatus circumferentially equally spaced along the periphery of the table 37, each being secured thereto by means of the flange 11 of the support 13 of the sealing apparatus. The base indicated at 12 in FIGURE 1 corresponds to the rotary table 37 of the sealing machine. Provided above said table 37 is a gas feeding device having a center valve 45 connected to distributing pipes 38, which are each connected with the inlet pipe 18 of the associated sealing apparatus for supplying clean and dry gas to the latter as required.

As the rotary table 37 rotates, a shell is automatically or manually fed to the shell holder 21 in the sleeve 16 of each of the sealing apparatus as it passes a loading station. Subsequently, a holder 22 supporting a stem having a semiconductor element mounted thereon is inserted into the sleeve 16. Thereafter dry and clean gas is fed from the center valve 45 through the distributing pipe 38 to thoroughly clean the shell and the stem and semiconductor element. Alternatively, if desired, the cleaning system may be arranged so that the cleaning fluid comprises oxygen in the first head position to form an oxidized film and then in the later head position is changed over to air.

At the sealing station, where gas is still being fed, a plunger or presser rod 41 of a mechanical, pneumatic, oil pressure or other suitable press means 40 mounted on a frame 39 bridging over the rotary table 37 depresses the upper end of the stem holder 22 of the sealing apparatus 10 thereby to hermetically seal the stem 33 and the shell 25 as described hereinbefore.

At the next or unloading station, a push rod 43 adapted to be operated by a cam 42 at a proper time rises along the through bore 23 in the shell holder 21 of the sealing apparatus 10 to lift the sealed assembly to permit the latter to be automatically or manually unloaded from the machine along with the stem holder 22. The unloaded assembly is received in a tray 44. Another stem for a semi-conductor element is then mounted on the stem holder 22, and which is reloaded in the sleeve 16.

Furthermore, the illustrated sealing machine comprises a pair each of loading heads, seal press heads, and unloading heads in symmetrical arrangement and is constructed so as to complete the sealing operation during half of one revolution of the rotary table. In operation, two attendants who are in diametrically opposite positions, successively load parts to be worked and unload the finished assemblies.

While one embodiment of the invention has been shown and described herein, it will be readily understood by those skilled in the art that the invention is not so limited but is susceptible of various changes and modifications without departing from the spirit and scope of the claimed invention.

What is claimed is:

1. Apparatus for sealing in a clean shell a clean semiconductor element mounted on a stem, said apparatus comprising a holder for said stem, a second holder for supporting said shell, said shell being adapted for enclosing said stem in sealing relation with said semiconductor element therein, a fixed sleeve having therein a hollow bore, said two holders being slidably supported in said bore and opposite to one another for movement towards and away from one another, said sleeve and holders cooperatively defining a closed chamber, gas feeding means for continuously circulating clean dry gas through the chamber defined by said two holders and said sleeve, and means for displacing said stem holding the semi-conductor element into said shell with said clean dry gas circulating in said chamber so that said semiconductor element is sealed into said shell with the dry gas.

2. Apparatus for sealing a clean semiconductor element in a clean shell, said apparatus comprising: a disc, means for rotating said disc, a plurality of sleeves arranged in uniform circumferential spacing on a peripheral portion of said disc, a holder for said semiconductor element, a holder for said shell, said holders being slidably supported in each of said sleeves and defining a chamber therewith, said semiconductor element and shell being supported opposite one another in said sleeves, said shell being adapted to enclose said semiconductor element in sealing relation, valve means for feeding clean and dry gas into each said chamber for providing an environment of said clean and dry gas therein, and means for displacing said holders towards one another, with said chamber having said environment of clean and dry gas therein such that said semiconductor element is hermetically sealed in said shell with said clean and dry gas.

References Cited in the file of this patent

UNITED STATES PATENTS

| | | |
|---|---|---|
| 2,367,393 | Green | Jan. 16, 1945 |
| 2,407,751 | Stewart | Sept. 17, 1946 |
| 2,683,924 | Schryver | July 20, 1954 |
| 2,757,440 | Carman | Aug. 7, 1956 |